United States Patent [19]

Berglund et al.

[11] Patent Number: 4,698,128
[45] Date of Patent: Oct. 6, 1987

[54] SLOPED CONTACT ETCH PROCESS

[75] Inventors: Robert K. Berglund, Mesa; Karl E. Mautz, Chandler; Roger Tyldesley, Mesa, all of Ariz.

[73] Assignee: Motorola, Inc., Schamburg, Ill.

[21] Appl. No.: 931,304

[22] Filed: Nov. 17, 1986

[51] Int. Cl.$^4$ .................. B44C 1/22; C03C 15/00; C03C 25/06

[52] U.S. Cl. .................. 156/643; 156/646; 156/651; 156/655; 156/659.1; 156/657; 204/192.32

[58] Field of Search .............. 156/643, 644, 646, 651, 156/653, 654, 655, 656, 657, 659.1, 661.1, 662; 204/192.32; 29/580, 591; 357/55, 65, 67; 427/38, 39, 88

[56] References Cited

U.S. PATENT DOCUMENTS 4,361,599 11/1982 Gorowitz et al. .................. 427/90
4,522,681 6/1985 Gorowitz et al. .................. 156/643

OTHER PUBLICATIONS

Weiss, "Plasma Etching of Oxides and Nitrides", Semiconductor International, Feb. 1983, pp. 56–62.
Bondur et al., "Shaping of Profiles In Sio2 by Plasma Etching", IBM, Hopewell Jut. N.Y. 12533, pp. 180–191.
Crabbe et al., "Tapering CVD SiO2 Vias for Improved Metal Step Coverage," Abstract No. 163, pp. 261–262.
Maber, "Selective Etching of Silcon Dioxide Films," Semiconductor International, May 1983, pp. 110–114.
Bogle-Rohwer et al., "Wall Profile Control in a Triode Etcher," Solid State Technology, Apr. 1985, pp. 251–255.
Nagy, "Sidewall Tapering in Reactive Ion Etching," J. Electro Chem. Soc.: Solid-State Science and Technology, vol. 132, No. 3, Mar. 1985, pp. 689–693.
Bondur et al., "Plasma Etching for SiO2 Profile Control," Solid State Technology, Apr. 1980, pp. 122–128.
Bonifield et al., "Sloped Contact Etching," pp. 25–29.
Crockett et al., "Single Wafer, Inline Plasma Etching of Silicon Dioxide," Tegal Corporation.
Peccoud et al., "Oxide Contact Windows Profiling in a Single Confined Discharge Structure," pp. 443–457.
Bergendahi et al., "Flexible Approach for Generation of Arbitrary Etch Profiles in Multilayer Films," Solid State Technolohy, Nov. 1984, pp. 107–112.
Saia et al., "Dry Etching of Tapered Contact Holes Using Multilayer Resist," pp. 270–284, No. 1.
Hinson et al., "Magnetron-Enhanced Plasma Etching of Silicon & Silicon Dioxide," Semiconductor International, Oct. 1983, pp. 103–106.
Saia et al., "Dry Etching of Tapered Contact Holes Using Multilayer Resist," Electrochemical Society, vol. 132, No. 8, pp. 1954–1957.
Chambers, "The Application of Reactive Ion Etching to the Definition of Patterns in Al-Si-Cu Alloy conductor Layers and Thick Silicon Oxide Films", Solid State Technology, Jan. 1983, pp. 83–86.
Lehmann et al., "Dry Etching for Pattern Transfer," Semiconductor International, pp. 92,94,96,98,100,102,104,106,108,110.
Cobum, "Pattern Transfer" Solid State Technology, Apr. 1986, pp. 117–122.

*Primary Examiner*—William A. Powell
*Attorney, Agent, or Firm*—Raymond J. Warren

[57] ABSTRACT

A process described provides a sloped contact etch. The process has the steps of: etching a substrate then removing the polymer that is produced during the substrate etch. These two steps are alternated until a desired depth is reached. Next, the resist is etched followed by an etch of the substrate. This is then repeated until the required depth is reached. By varying the duration and repetition of the etches, the slope of the etch can be regulated.

22 Claims, 10 Drawing Figures

SLOPED CONTACT ETCH PROCESS

BACKGROUND OF THE INVENTION

This invention relates, in general, to contact etch processes and, more particularly, to sloped contact etch processes.

In the manufacture of semiconductor devices, insulating layers such as silicon dioxide, phosphorus-doped silicon dioxide, silicon nitride, etc., are used to electrically separate conduction layers such as doped polycrystalline silicon (polysilicon), aluminum, refractory metal silicides, etc. It is often required that the conduction layers be interconnected through holes in the insulating layers. These holes are referred to as contacts or vias and often must exhibit specific characteristics, such as a sloped or tapered profile. The sloped profile is necessary so that the step coverage of the conduction layer into the hole is of adequate thickness. Standard techniques for deposition of the conduction layers include sputtering and evaporation. Both of these techniques provide step coverage of the contact hole that is sensitive to the contact profile. Vertical contact profiles often result in unacceptable step coverage. Highly sloped contact profiles result in good step coverage, however, the contact is often excessively enlarged in the process. This enlargement may cause unwanted electrical shorting between or within conduction layers, and may also reduce the density of the circuit features, that is, limit how close together the devices can be placed.

Providing adequate contact slope is critical to achieving acceptable contact step coverage. Several methods of producing sloped contacts are known in the art. These can be grouped into the general categories of: wet etch; wet/dry etch, reactive ion etch (RIE); isotropic/RIE etch; and resist erosion technique.

The wet etch technique uses standard photoresist exposure and development techniques to print the required contact pattern on the insulating layer. To further enhance the slope of this process, $CF_4/O_2$ plasma pretreats have been used to promote preohmic taper. The plasma pretreat is difficult to control and provides non-uniform tapers. The profile of the sides of the photoresist opening are vertical for this type of etch. As the insulating layer is etched, with $NH_4F:HF$ acids or the like, the photoresist will protect the areas not exposed. The chemical wet etch will etch the insulating layer isotropically so that the contact profile is sloped. This process significantly enlarges the contact area due to the non-directionality of the wet etch. In addition, the acids used suffer from high particulate counts which contaminate the contact area.

The wet/RIE technique process has the disadvantage of requiring two separate etch processes and still uses the acid as in the wet etch. To create an initial slope profile followed by a less sloped profile in the oxide contact (funnel shaped preohmic), two photoresist steps are used each requiring a different acid and/or dry etch to accomplish each objective. Problems resulting from this process include: resist adhesion and phosphorus concentration differences on the oxide surface that cause erratic size and taper of preohmics; excessive undercutting of the preohmics can be caused by variations in the acid strength from batch to batch, changes in buffering concentrations inherent in the acid solutions (crystals), and temperature variations; and alignment tolerances required result in significant photoresist redo rates.

The isotropic/RIE etch technique first etches the contact pattern delineated by the photoresist into the underlying glass substrate using a high pressure isotropic plasma etch ($CF_4$, 8.5%). The etch is completed with a selective RIE etch step to remove the remaining oxide. The isotropic step of this method is described in U.S. Pat. No. 4,361,599 issued to Robert L. Wourms. This technique results in a cusp shaped taper rather than a sloped taper; has poor process stability; and is labor and handling intensive.

In the resist erosion technique, the required contact pattern is printed on the insulating layer, again using standard photoresist exposure and development techniques. Next, the photoresist layer is baked such that the resist flows giving the walls defining the openings in the resist a tapered or sloped profile. Next, the device is dry etched in an environment that will etch the substrate and resist at the same time. This will replicate the sloped resist profile into the substrate. The disadvantages in this process are that a relatively thick resist layer is required; the scaling of the process does not lend itself to VLSI geometries; and the reproducibility, across one or numerous wafers, of the particular slope of the baked resist is very poor.

Another type of the resist erosion technique utilizes resist faceting. First, standard photoresist exposure and development techniques are again used to print the required contact pattern on the insulating layer. A dry etch of the oxide is then conducted using an in situ resist tapering process. By using a low pressure and high oxygen flow etch, the corners or edges of the resist will etch faster than the planar resist. This results in a sloped resist profile referred to as resist faceting. This slope is then replicated into the substrate using the same technique described for the resist erosion technique.

Another form of resist erosion technique is a two step method and uses a two-layer photoresist mask. This is described in Saia, et al., "Dry Etching of Tapered Contact Holes Using a Multilayer Resist", 132 *J. Electrochemistry Soc.: Solid-State Science and Technology* 1954 (August, 1985). Here the authors describe the process using a two-layer photoresist mask, where the bottom layer is poly (methyl methacrylate) (PMMA) and a plasma gas etch containing $CHF_3$, argon and oxygen. The photoresist to oxide etch rate ratios ranged from 1.5:1 to 1:1.

One of the drawbacks of resist faceting techniques is the limit of the taper produced in the substrate. In order to achieve an appreciable sloped resist profile, a large amount of the resist must be consumed during the faceting step. This resist consumption requires both thickening of the resist and limiting of the facet etch time, which is approximately one-half of the total etch time, to prevent resist break through and etching to areas once protected.

The faceting process increases the contact size delineated by the resist prior to the final etch step that removes remaining dielectric. The disadvantages of this technique include the enlargement of the base of the contact beyond the original size delineated in the resist. The final facet etch step, that is required to clear the oxide, will tend to destroy the slope character of the contact.

In general, as devices and line widths have become smaller, wet etching has proved unsuitable for fine line etching below about 3 $\mu$m. In addition, profile control has also driven the industry in the direction of plasma (dry) etching. Overviews of etching are reported in Weiss, "Plasma Etching of Oxides and Nitrides", *Semiconductor International*, 56 (February, 1983), and in Coburn, "Pattern Transfer", *Solid State Technology*, 117 (April, 1986).

While the ideal contact through a dielectric layer between two conduction layers would be a completely metal filled truly vertical contact hole or via, technology to reliably provide such contacts is not yet in place. Therefore, there is still a great need for the ability to control the slope of the contract walls so as to permit good step coverage and contact to the lower conductive layer by the overlying conductive layer.

An article by Bergendahl et al., "A Flexible Approach for Generation of Arbitrary Etch Profiles in Multilayer Films", *Solid State Technology*, 107 (November., 1984), describes an additional method, known as multi-step contour (MSC) etching. MSC is described as combining independently optimized process modules to form a complete process. The process described in the Bergendahl article has the problems of filament development and excessive bulk resist removal, and stresses induced ny power pulses during all process steps.

SUMMARY OF THE INVENTION

Accordingly, it is an object of the present invention to provide a sloped contact etch process that overcomes the above deficiencies.

A further object of the present invention is to provide a sloped contact etch process that does not require the use of a resist flowing step.

Another object of the present invention is to provide a sloped contact etch process that can be selectively varied to provide differing slopes.

Still another object of the present invention is to provide a sloped contact etch process that uses selective etch processes.

Yet another object of the present invention is to provide a sloped contact etch process that will provide improved metal step coverage.

A further object of the present invention is to provide a sloped contact etch process that reduces the required thickness of the resist layer.

Another object of the present invention is to provide a sloped contact etch process that increases yield.

Still another object of the present invention is to provide a sloped contact etch process that can be performed in a single continuous program in a reactive ion etch tool.

Yet another object of the present invention is to provide a sloped contact etch process that utilizes a single photoresist process step.

A particular embodiment of the present invention comprises a sloped contact etch process having the steps of: etching a substrate; and removing the polymer that is produced during the substrate etch. These two steps are alternated until a desired depth is reached. Next, the resist is etched followed by an etch of the substrate. This is then repeated until the required depth is reached. By varying the duration and repetition of the etches, the slope of the etch can be regulated.

DETAILED DESCRIPTION OF THE DRAWINGS

Figure 1:
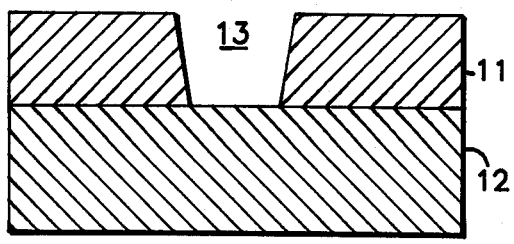
FIGS. 1–6 are process flow diagrams of a sloped contact etch process embodying the present invention.

Referring to FIGS. 1–6, process flow diagrams of integrated circuits, showing one embodiment of the present invention, are illustrated. In FIG. 1 a substrate 12 is illustrated having a layer of photoresist 11 disposed thereon. The photoresist is masked and developed to form the contact via 13. As shown here contact via 13 is defined by sloped walls on resist 11. It should be noted that the sloped walls of resist 11 are caused by the processing method used to form via 13 and is not required by the present process. The present process will work as well with a via 13 defined by straight walls. The main element here is to have the base width of via 13 the size of the desired contact base.

Figure 2:
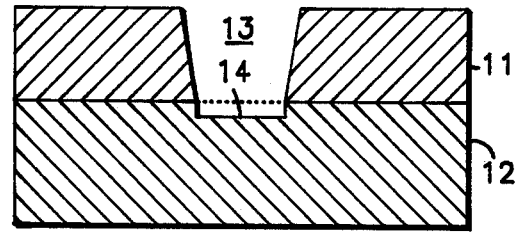

Next, as shown in FIG. 2, the contact area is etched into substrate 12. This is done in a series of processing steps which includes etching the substrate combined with periodic filament removal steps. One particular embodiment of this process consists of: (1) a 6.7 minute etch using $CHF_3$ (85 cc) and $O_2$ (8 cc); and (2) a 0.8 minute filament removal using A5 (150 cc) and $O_2$ (50 cc). Steps one and two are repeated until the desired depth, indicated by line 14, is reached.

This process serves to prevent the development of filaments in the contact via. One example of these filaments can be seen in FIGS. 7A and B. Filaments are caused by polymer build up during the etching steps in standard processes. The polymer buildup in areas is sufficient to prevent the substrate, located below it, from etching. This results from the polymer forming a protective cap that prevents the substrate below from being etched. These filaments prevent good coverage of the walls by the metal deposited in via 13 once the contact etch is completed.

It should be noted that the frequency and duration of the above steps can be varied to obtain the desired depth. It should also be understood that different chemical compositions can be used that will result in the same type of etching of the substrate and polymer.

It has been found that ion bombardment, with an $Ar-O_2$ mixture provides the preferable amount of filament removal. In addition, Argon is used with Oxygen to reduce the bulk resist removal rate since this has been found not to significantly reduce the lateral removal rate.

This process is designed to be run in a reactive ion etch (RIE) reactor in a continuous process. To accomplish this continuous process, the power is ramped on and off. This has been found to avoid the problems, such as degradation of gate integrity, caused by sudden power changes.

Figure 3:
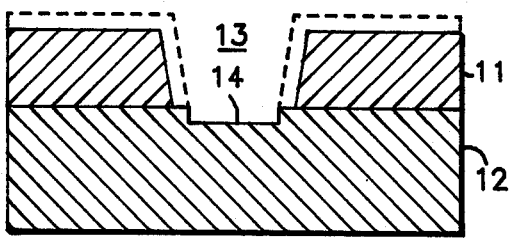

The next step in the process is illustrated in FIG. 3. This consists of etching the resist. As shown, resist 11 has been etched back exposing more of the surface of substrate 12. In one particular embodiment, the etchant comprises 150 cc Argon and 50 cc Oxygen and has a duration of 2.1 minutes. As illustrated in FIG. 3, this etching step selectively etches the resist layer.

Figure 4:
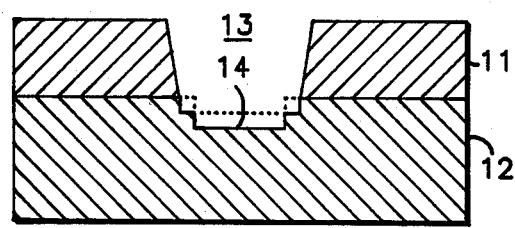
Figure 5:
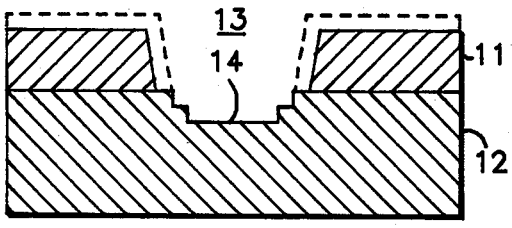
Figure 6:
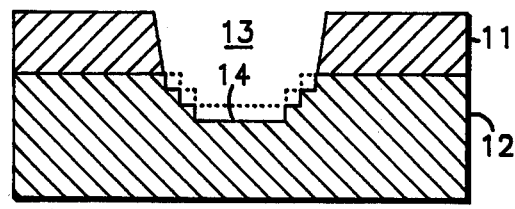

The substrate is then etched again providing the stepped outline shown in FIG. 4. In one particular embodiment, the etchant comprises 85 cc $CHF_3$ and 8 cc $O_2$. This causes the substrate to be selectively etched, as illustrated. FIGS. 5 and 6 show the steps in FIGS. 3 and 4, respectively, repeated.

As described above, the disclosed process does not require the use of resist flowing techniques. The overall process set out above can be written as follows:

$$(X6.7', Y0.8')^2, X6.7', (Y2.1', X2.5')^4.$$

where:

X represents 85 cc $CHF_3$ and 8 cc $O_2$; and
Y represents 150 cc A and 50 cc $O_2$.

The above process equation is but one embodiment of the present invention. It should be noted here that by reducing the etch times and increasing their frequency, a smoother wall may be formed having smaller steps. This allows the slope to be selectively varied.

Several process embodiments are set out below as examples of the present invention. The processes were carried out in an RIE reactor:

| PROCESS I: (Morenci Process) | | |
|---|---|---|
| Step I: | $CHF_3$ = 85 cc: | Servo Bias = −475 V |
| | $O_2$ = 8 cc: | Time = 5 min. |
| | | Pressure = 50 mTORR |
| RF off and 60 sec. Pump down between steps. | | |
| Step II: | $O_2$ = 50 cc: | Servo Pwr = 500 W |
| | | Time = 2 min. |
| | | Pressure = 50 mTORR |
| RF off and 60 sec. Pump down between steps. | | |
| Step III: | $CHF_3$ = 85 cc: | Servo Bias = −475 V |
| | $O_2$ = 8 cc: | Time = 2 min. |
| | | Pressure = 50 mTORR |
| RF off and 60 sec. Pump down between steps. | | |
| Step IV: | $O_2$ = 50 cc | Servo Pwr = 500 W |
| | | Time = 2 min. |
| | | Pressure = 50 mTORR |
| RF off and 60 sec. Pump down between steps. | | |
| Step V: | $CHF_3$ = 85 cc: | Servo Bias = −475 V |
| | $O_2$ 8 cc: | Time = 2 min. |
| | | Pressure = 50 mTORR |

| PROCESS II: (Morenci Process) Small Tiers | | |
|---|---|---|
| Step I: | $CHF_3$ = 8 cc: | Servo Bias = −475 V |
| | $O_2$ = 8 cc: | Time = 25 min. |
| | | Pressure = 50 mTORR |
| RF off and 60 sec. Pump down between steps. | | |
| Step II: | $O_2$ = 50 cc: | Servo Pwr = 500 W |
| | | Time = 3 min. |
| | | Pressure = 50 mTORR |
| RF off and 60 sec. Pump down between steps. | | |
| Step III: | $CHF_3$ = 85 cc: | Servo Bias = −475 V |
| | $O_2$ = 8 cc: | Time = 4 min. |
| | | Pressure = 50 mTORR |
| RF off and 60 sec. Pump down between steps. | | |
| Step IV: | $O_2$ = 50 cc: | Servo Pwr = 500 W |
| | | Time = 3 min. |
| | | Pressure = 50 mTORR |
| RF off and 60 sec. Pump down between steps. | | |
| Step V: | $CHF_3$ = 85 cc: | Servo Bias = −475 V |
| | $O_2$ = 8 cc: | Time = 4 min. |
| | | Pressure = 50 mTORR |
| RF off and 60 sec. Pump down between steps. | | |
| Step VI: | $O_2$ = 50 cc: | Servo Pwr = 500W |
| | | Time = 3 min. |
| | | Pressure = 50 mTORR |
| RF off and 60 sec. Pump down between steps. | | |
| Step VII: | $CHF_3$ = 85 cc: | Servo Bias = −475V |
| | $O_2$ = 8 cc: | Time = 4 min. |
| | | Pressure = 50 mTORR |

| PROCESS III: (Large Tiers) | | |
|---|---|---|
| Step I: | $CHF_3$ = 85 cc: | Servo Bias = −475 V |
| | $O_2$ = 8 cc: | Time = 25 min. |
| | | Pressure = 50 mTORR |
| RF off and 60 sec. Pump down between steps. | | |
| Step II: | $O_2$ = 50 cc: | Servo Pwr = 500 W |
| | | Time = 5 min. |
| | | Pressure = 50 mTORR |

| -continued | | |
|---|---|---|
| RF off and 60 sec. Pump down between steps. | | |
| Step III: | $CHF_3$ = 85 cc: | Servo Bias = −475 V |
| | $O_2$ = 8 cc: | Time = 5 min. |
| | | Pressure = 50 mTORR |
| RF off and 60 sec. Pump down between steps. | | |
| Step IV: | $O_2$ = 50 cc: | Servo Pwr = 500 W |
| | | Time = 5 min. |
| | | Pressure = 50 mTORR |

| PROCESS IV: | | |
|---|---|---|
| Step I: | $CHF_3$ = 85 cc: | Servo Bias = −475 V |
| | $O_2$ = 8 cc: | Time = 25 min. |
| | | Pressure = 50 mTORR |
| RF off and 60 sec. Pump down between steps. | | |
| Step II: | $O_2$ = 50 cc: | Servo Pwr = 500 W |
| | | Time = 3 min. |
| | | Pressure = 50 mTORR |
| RF off and 60 sec. Pump down between steps. | | |
| Step III: | $CHF_3$ = 85 cc: | Servo Bias = −475 V |
| | $O_2$ = 8 cc: | Time = 3 min. |
| | | Pressure = 50 mTORR |
| RF off and 60 sec. Pump down between steps. | | |
| Step IV: | $O_2$ = 50 cc: | Servo Pwr = 500 W |
| | | Time = 3 min. |
| | | Pressure = 50 mTORR |
| RF off and 60 sec. Pump down between steps. | | |
| Step V: | $CHF_3$ = 85 cc: | Servo Bias = −475 V |
| | $O_2$ = 8 cc: | Time = 3 min. |
| | | Pressure = 50 mTORR |
| RF off and 60 sec. Pump down between steps. | | |
| Step IV: | $O_2$ = 50 cc: | Servo Pwr = 500 W |
| | | Time = 3 min. |
| | | Pressure = 50 mTORR |
| RF off and sec. Pump down between steps. | | |
| Step VII: | $CHF_3$ = 85 cc: | Servo Bias = −475 V |
| | $O_2$ = 8 cc: | Time = 3 min. |
| | | Pressure = 50 mTORR |

| PROCESS V: | | |
|---|---|---|
| Step I: | $CHF_3$ = 85 cc: | Servo Bias = −475 V |
| | $O_2$ = 8 cc: | Time = 25 min. |
| | | Pressure = 50 mTORR |
| Step II: | $O_2$ = 50 cc: | Servo Pwr = 500 W |
| | | Time = 3 min. |
| | | Pressure = 50 mTORR |
| Step III: | $CHF_3$ = 85 cc: | Servo Bias = −475 V |
| | $O_2$ = 8 cc: | Time = 3 min. |
| | | Pressure = 50 mTORR |
| Step IV: | $O_2$ = 50 cc: | Servo Pwr = 500 W |
| | | Time = 3 min. |
| | | Pressure = 50 mTORR |
| Step V: | $CHF_3$ = 85 cc: | Servo Bias = −475 V |
| | $O_2$ = 8 cc: | Time = 3 min. |
| | | Pressure = 50 mTORR |
| Step VI: | $O_2$ = 50 cc: | Servo Pwr = 500 W |
| | | Time = 3 min. |
| | | Pressure = 50 mTORR |
| Step VII: | $CHF_3$ = 85 cc: | Servo Bias = −475 V |
| | $O_2$ = 8 cc: | Time = 3 min. |
| | | Pressure = 50 mTORR |

Figure 7A:
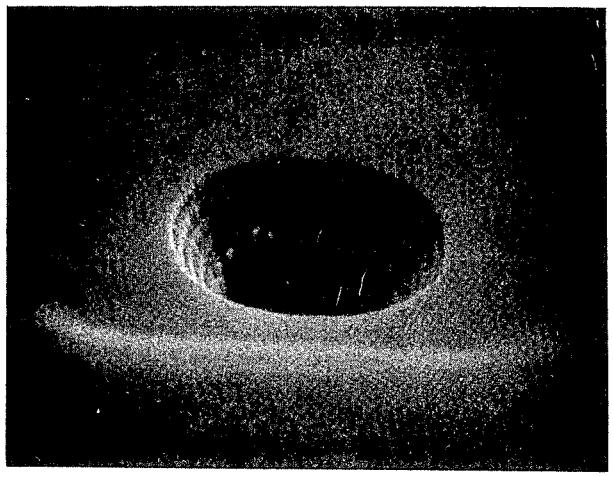
FIGS. 7A and 7B are photographs of vias produced utilizing prior art sloped contact etch processes.
Figure 7B:
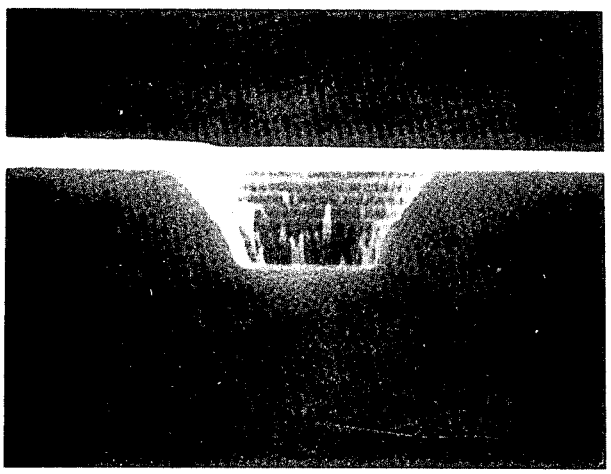
Figure 8A:
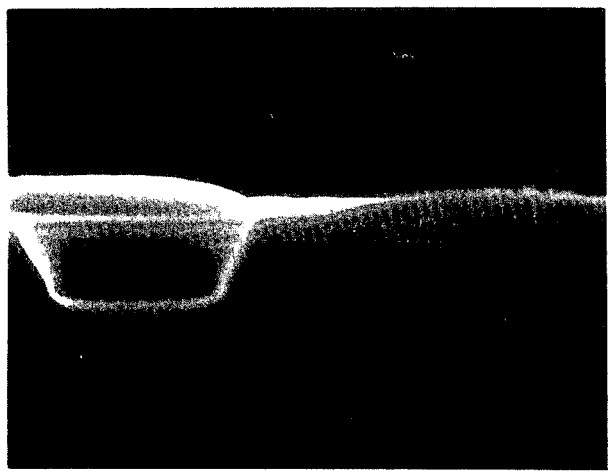
FIGS. 8A and 8B are photographs of vias produced utilizing the sloped contact etch process of the present invention.
Figure 8B:
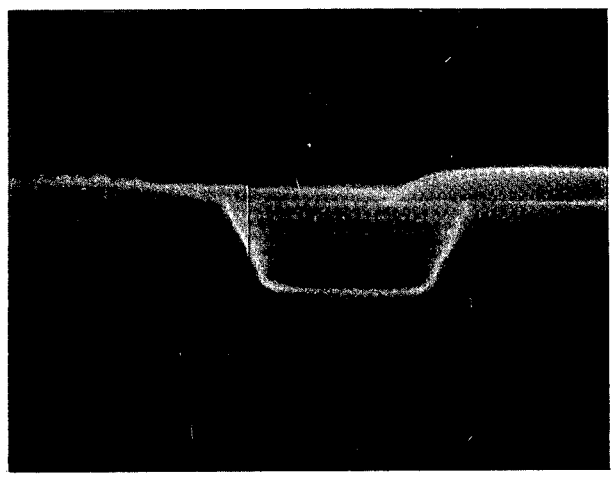

As can be seen in the photos of FIGS. 8A and 8B, contact vias formed by this process have a much more uniform, smooth wall as opposed to the prior process, photos FIGS. 7A and 7B. The filaments have been eliminated thereby providing improved step coverage when plated or filled which increases the yield.

Thus, it is apparent to one skilled in the art that there has been provided in accordance with the invention, a device and method that fully satisfies the objects, aims and advantages set forth above.

While the invention has been described in conjunction with specific embodiments thereof, it is evident that many alterations, modifications, and variations will be apparent to those skilled in the art in light of the foregoing description. Accordingly, it is intended to embrace all such alterations, modifications and variations in the appended claims.

We claim:

1. A process is claimed for providing a sloped contact etch comprising the steps of:
   (a) etching a substrate a first time in an area defined by a resist layer;
   (b) removing a polymer produced on said substrate during said step of etching said substrate a first time;
   (c) etching said resist layer thereby increasing the area of said substrate defined by said resist layer; and
   (d) etching said substrate in the area defined by said resist layer.

2. The process of claim 1 further comprising, following step (b), the steps of:
   etching said substrate a second time in said area defined by said resist layer; and
   removing a polymer produced on said substrate during said step of etching said substrate a second time.

3. The process of claim 1 further comprising, following step (d), the step of repeating steps (c) and (d) until a desired depth in said substrate is reached.

4. The process of claim 1 wherein said etching in steps (a) and (d) utilizes an etchant comprising $CHF_3$ and $O_2$.

5. The process of claim 1 wherein said etching in step (b) utilizes an etchant comprising Argon and Oxygen.

6. The process of claim 1 wherein said etching is performed in a reactive ion etch reactor.

7. The process of claim 1 wherein a power level is ramped from a first level during step (a) down to a second level and ramped back up to a third level during step (c).

8. A process is claimed for providing a sloped contact etch comprising the steps of:
   (a) etching a substrate a first time in an area defined by a resist layer;
   (b) removing a polymer produced on said substrate during said step of etching said substrate a first time;
   (c) etching said substrate a second time in said area defined by said resist layer;
   (d) removing a polymer produced on said substrate during said step of etching said substrate a second time;
   (e) etching said substrate a third time in said area defined by said resist layer;
   (f) etching said resist layer thereby increasing the area of said substrate defined by said resist layer; and
   (g) etching said substrate in the area defined by said resist layer.

9. The process of claim 8 wherein the etching of steps (a), (c) and (e) has a duration of approximately 6.7 minutes.

10. The process of claim 8 wherein the etching of steps (b) and (d) has a duration of approximately 0.8 minutes.

11. The process of claim 8 wherein the etching of step (f) has a duration of approximately 2.1 minutes.

12. The process of claim 8 wherein the etching of step (g) has a duration of approximately 2.5 minutes.

13. The process of claim 8 further comprising, following step (g), the step of repeating steps (f) and (g) until a desired depth is reached.

14. The process of claim 8 wherein said etching in steps (a), (c), (e) and (g) utilizes an etchant comprising $CHF_3$ and $O_2$.

15. The process of claim 8 wherein said etching in steps (b), (d) and (f) utilizes an etchant comprising Argon and Oxygen.

16. The process of claim 8 wherein said etching is performed in a reactive ion etch reactor.

17. The process of claim 8 wherein a power level is ramped from a first power level, utilized in steps (a), (c) (e) and (g), down to a second level and ramped back up to a third level, utilized in steps (b), (d) and (f).

18. A process is claimed for providing a sloped contact etch comprising the steps of:
   (a) etching a substrate a first time in an area defined by a resist layer;
   (b) removing a polymer produced on said substrate during said step of etching said substrate a first time;
   (c) etching said substrate a second time in said area defined by said resist layer;
   (d) removing a polymer produced on said substrate during said step of etching said substrate a second time;
   (e) etching said substrate a third time in said area defined by said resist layer;
   (f) etching said resist layer thereby increasing the area of said substrate defined by said resist layer;
   (g) etching said substrate in the area defined by said resist layer; and
   (h) repeating steps (f) and (g) until a via of a predetermined depth is reached.

19. The process of claim 18 wherein the etching of steps (a), (c) and (e) has a duration of approximately 6.7 minutes and utilizes an etchant comprised of $CHF_3$ and $O_2$.

20. The process of claim 18 wherein the etching of steps (b) and (d) has a duration of approximately 0.8 minutes and utilizes an etchant comprised of Argon and Oxygen.

21. The process of claim 18 wherein the etching of step (f) has a duration of approximately 2.1 minutes and utilizes an etchant comprised of $CHF_3$ and $O_2$.

22. The process of claim 18 wherein the etching of step (g) has a duration of approximately 2.5 minutes and utilizes an etchant comprised of Argon and Oxygen.

* * * * *